(12) United States Patent
Waeckerle

(10) Patent No.: US 6,872,596 B2
(45) Date of Patent: Mar. 29, 2005

(54) METHOD OF TRANSFERRING SEMICONDUCTOR CHIPS

(75) Inventor: Uwe Waeckerle, Bruchsal (DE)

(73) Assignee: Rohwedder Microtech GmbH & Co. KG, Bruchsal (DE)

( * ) Notice: Subject to any disclaimer, the term of this patent is extended or adjusted under 35 U.S.C. 154(b) by 13 days.

(21) Appl. No.: 10/677,606

(22) Filed: Oct. 2, 2003

(65) Prior Publication Data

US 2004/0077125 A1 Apr. 22, 2004

Related U.S. Application Data

(63) Continuation-in-part of application No. 09/961,003, filed on Sep. 21, 2001, now abandoned.

(30) Foreign Application Priority Data

Sep. 21, 2000 (DE) .......................... 100 46 899

(51) Int. Cl.[7] .......................... H01L 21/44; H01L 21/48; H01L 21/50
(52) U.S. Cl. ..................................... 438/113
(58) Field of Search ............................. 438/106, 108, 438/110–111, 113

(56) References Cited

PUBLICATIONS

Derwent abstracted publication JP58222013 "Method for separating plates" Jul. 27, 1984.*

* cited by examiner

*Primary Examiner*—Craig A. Thompson
(74) *Attorney, Agent, or Firm*—Klaus J. Bach

(57) ABSTRACT

In a method of transferring semiconductor chips from a substantially flat wafer having an active side with a plurality of individual semiconductor chips formed thereon and a support side opposite the active side to a receiver, and the wafer is attached with its support side by way of an adhesive sheet to a support structure and is cut into segments corresponding to the individual semiconductor chips so that the semiconductor chips are individually supported on the adhesive sheet with their active sides exposed and facing away from the adhesive sheet, the support structure is moved with the individual semiconductor chips into a position wherein a particular semiconductor chip to be removed is positioned in a removal location above a receiver and the adhesive sheet is pushed downwardly at the particular semiconductor chip location so as to release the particular semiconductor chip and transfer it with the active side thereof onto the receiver.

4 Claims, 2 Drawing Sheets

METHOD OF TRANSFERRING SEMICONDUCTOR CHIPS

This is a continuation-in-part application of U.S. application Ser. No. 09/961,003 filed Sep. 21, 1901 now abandoned.

The invention relates to a method of transferring semiconductor chips from a substantially flat wafer having a plurality of semiconductor chips incorporated therein.

Semiconductor chips are conventionally manufactured in large numbers on a semiconductor wafer. In order to be able to process the individual semiconductor chips further, the wafer is arranged with the active side facing upward, that is to say with the side where the semiconductor chips are accessible via connecting areas or connecting elements, and is adhesively bonded to a thin sheet. Then, the silicon wafer prepared in this way is sawn up, so that the individual semiconductor chips formed thereby can be removed separately. A semiconductor chip, after being removed, is placed on a substrate with the active side facing upwardly, and the connecting areas or connecting elements are then connected from above by thin conductors, to the connecting points on the substrate by means of known wire bonding devices.

In recent times, semiconductor chips have been developed which, on their active side, have connecting spheres (bumps) or other connecting elements. During the further processing, these are placed with the active side downward on connecting elements on a substrate, the connecting elements often being arranged in the manner of a matrix. Since, for manufacturing reasons, the semiconductor chips continue to be arranged on the wafer with the active side facing upwardly, the chips have to be turned in order to place them onto the substrate, so that their active sides face downwardly. To this end, as a rule "flippers" or pivoting devices are integrated into conventional die-bonding devices.

When processing a plurality of "flip-chips" on a wafer, each semiconductor chip is first removed from the wafer by a pick-up device, then pivoted through 180° about a substantially horizontal axis and then transferred to the actual handling device, which deposits the chips on the substrate.

However, systems of this type are very slow. In addition, turning the semiconductor chip constitutes a complicated intermediate step with a relatively high failure rate.

It is therefore the object of the present invention to provide a method of transferring semiconductor chips in which the disadvantages of the prior art are avoided.

SUMMARY OF THE INVENTION

In a method of transferring semiconductor chips from a substantially flat wafer having an active side with a plurality of individual semiconductor chips formed thereon and a support side opposite the active side to a receiver, and the wafer is attached with its support side by way of an adhesive sheet to a support structure and is cut into segments corresponding to the individual semiconductor chips so that the semiconductor chips are individually supported on the adhesive sheet with their active sides exposed and facing away from the adhesive sheet, the support structure is moved with the individual semiconductor chips into a position wherein a particular semiconductor chip to be removed is positioned in a removal location above a receiver and the adhesive sheet is pushed downwardly at the particular semiconductor chip location so as to release the particular semiconductor chip and transfer it with the active side thereof onto the receiver.

Preferably the receiver is a transport device, whereby said semiconductor is moved to a transfer location for being picked up by a handling device. The individual semiconductor chip is picked up by the handling device with the exposed active surface thereof facing downwardly for deposit in the same orientation in a housing or for installation on a printed circuit board. Also the individual semiconductor chip is moved from the removal location to said transfer location in a plane extending parallel to said wafer, so as to minimize the requirements for the movement of the semiconductor chip from the removal location to said transfer location.

It is noted that the wafer is supported in the removal location, such that the active faces of the semiconductor chips are oriented downwardly, that is to say the active side of the semiconductor chips, on which contact can later be made with the semiconductor device, are facing downwardly. By arranging the wafers in such a way that the active side of the semiconductor chip is oriented downward, it is not necessary to turn the removed semiconductor chips for the further processing of the latter. As a result, the step of turning the semiconductor chip is eliminated. This saves both processing time and the provision of a technically complicated turner station for the semiconductor chips. In addition, the chip transfer procedure has a lower failure rate.

With the method according to the invention, the removed semiconductor chips is furthermore moved by the chip transfer device substantially parallel to the plane of the wafer. This permits faster further processing of the removed semiconductor chips.

The removal device of the chip transfer apparatus includes an ejector pin, which is arranged at the removal location and above the wafer and also faces the transport device. By means of the ejector pin, the semiconductor chip to be removed can be pushed off the wafer. It is then picked up by means of a pick-up device, which is provided on the transport device and moved from the removal position to the transfer position. The interaction of the ejector pin with the pick-up device permits reliable transfer of the semiconductor chip to be removed from the wafer to the transport device.

The transport device is preferably of cross-like design and can be rotated about an axis which is substantially perpendicular to the plane defined by the arms of the cross-like transport device and extends through the point of symmetry of the cross-like transport device. As a result, one or more pick-up devices, by means of which removed semiconductor chips can be moved between the removal position and the transfer position, can be arranged on each of the arms of the transport device.

The chip transfer apparatus together with the wafer, the removal device, the transport device and the pick-up devices, can be arranged horizontally or vertically or else inclined at any desired angle. A semiconductor chip removed from the wafer can be moved substantially parallel to the plane of the wafer, with the exception of small movements during the removal of the semiconductor chip from the wafer.

From the transfer position, the removed semiconductor chip can be transferred by means of a handling device, such as pick-and-place device, to arrange the semiconductor chip in a housing or on a printed circuit board.

According to the invention, semiconductor chips are in particular flip-chips or other types of semiconductor chips, which are fitted to a substrate or to a printed circuit board with the active side facing downwardly.

For transferring semiconductor chips from a substantially flat wafer including a plurality of semiconductor chips, first the wafer with the semiconductor chips is so arranged, that the chips are supported with their active sides facing downwardly. Then, for each semiconductor chip to be removed, the wafer is positioned above a removal location, so that the semiconductor chip to be removed is arranged above the removal location. Then, the semiconductor chip to be removed is removed downward from the wafer, and the removed semiconductor chip is transported from the removal position to a transfer position.

In this case, turning the removed semiconductor chip is not necessary, and the removed semiconductor chip can be arranged directly, without being turned, for example by means of a handling device, from the transfer position into a housing for semiconductor chips or placed onto a printed circuit board. The semiconductor chip is moved substantially parallel to the plane of the wafer. Generally, the semiconductor chip is a flip-chip or another semiconductor chip which is to be arranged with the active side facing downwardly in a housing or on a printed circuit board.

The invention will be described below in more detail on the basis of the accompanying drawings.

DESCRIPTION OF PREFERRED EMBODIMENTS

Figure 1:
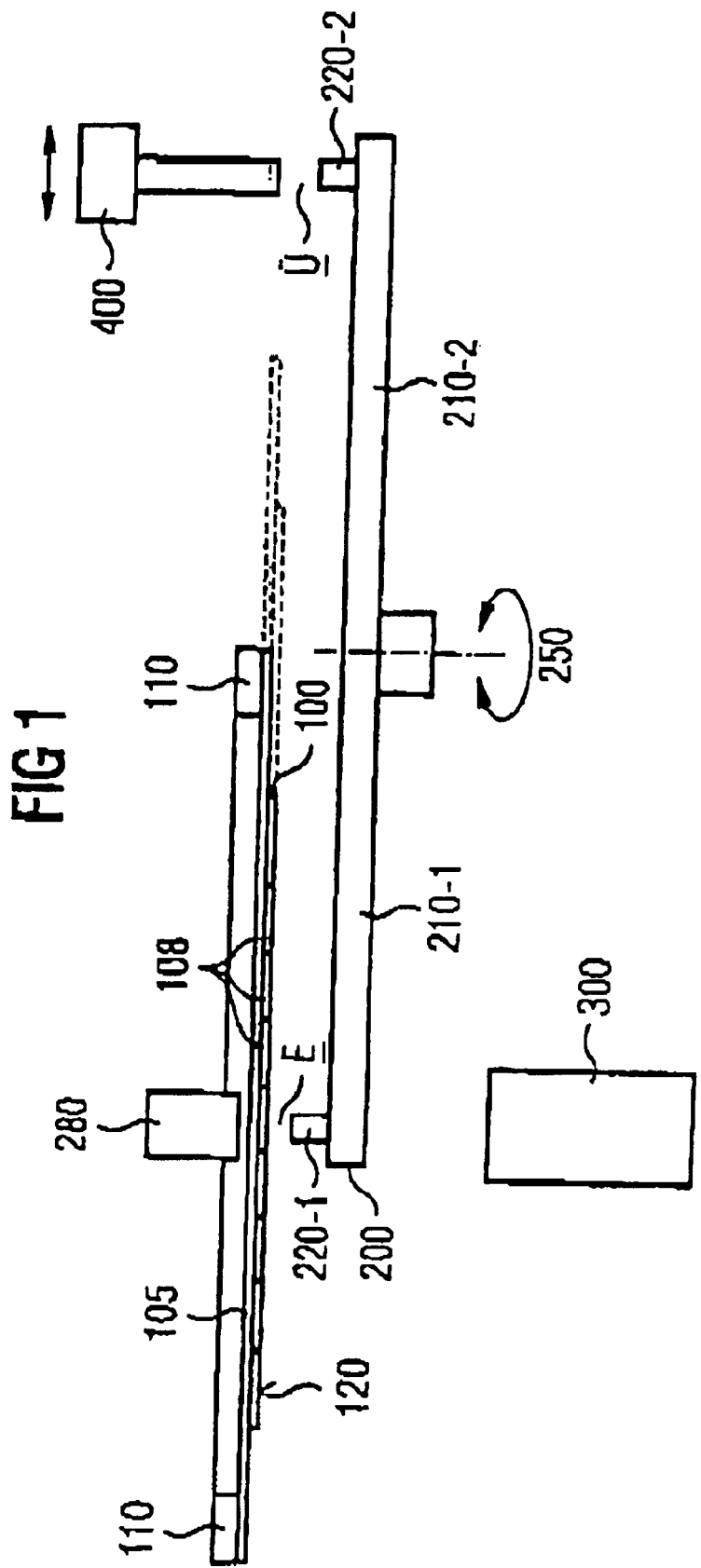
FIG. 1 is a schematic side view of a chip transfer apparatus.

FIG. 1 shows an embodiment of a chip transfer apparatus for the method according to the invention. The apparatus includes a holding structure 110, on which a wafer 100 is fixed to a thin sheet 105, for example by being adhesively bonded to the sheet 105. The wafer is arranged with the active side 120 thereof facing downwardly. By means of the holding device 110, the thin sheet 105 with the wafer 100 can be moved, substantially within the plane of the wafer, relative to a removal location E. The wafer 100 comprises a plurality of semiconductor chips 108, which form the active side 120 of the wafer and are accessible from this active side 120. The wafer 100 can, for example, be provided with the thin sheet 105 on its rear, which faces away from the active side 120. In order to remove the semiconductor chips 108 from the wafer 100 the latter can be sawn up into individual segments, which correspond to the semiconductor chips 108. The thin sheet 105 is attached to the wafer 100 before the sawing operation. The segments separated from one another by sawing are held on the thin sheet 105 by means of an adhesive layer formed between the wafer 100 and the thin sheet 105. A semiconductor chip 108 to be removed is arranged close to the removal location E by means of the holding device 110. By means of an ejector pin 280, the semiconductor chip 108 to be removed can be removed from the wafer 100 from the rear by pushing the thin sheet 105 downward whereby it is stretched. The chip 108 can then be picked up by a pick-up device 220-1. In this case, the pick-up device 220-1 is likewise positioned in the vicinity of the removal location E and is arranged on a transfer device 200. The transfer device 200 may be of cross-like design and have a plurality of arms 210-1, 210-2 each having one or more pick-up devices 220-1 and 220-2. The transfer device 200 can be rotated about an axis 250, which extends substantially perpendicular to the plane defined by the arms 210-1, 210-2 and through the point of symmetry of the transfer device 200. Underneath the transfer device 200, a camera 300 can be arranged in the vicinity of the removal location E, by which camera the removal of semiconductor chips from the wafer 100 by the ejector pin 280 and the pick-up device 220-1 can be monitored.

According to the invention, the removed semiconductor chip 108 is picked up by the pick-up device 220-1 of the transfer apparatus 200 with the active side facing downwardly. The passive side of the removed semiconductor chip 108, facing away from the active side, points upward in this case. By means of the transfer apparatus 200, the removed semiconductor chip 108 with the passive side upward is transported from the removal location E to a transfer location Ü. At the transfer location Ü, the removed semiconductor chip 108 can be picked up by a handling device 400 and submitted to further processing.

Since the removed semiconductor chip is transported to the handling device 400 with the passive side facing upwardly, additional pivoting of the semiconductor chip 108 is not necessary. The semiconductor chip 108 can be processed further directly by means of the handling device 400. For example, the semiconductor chip is transported by the handling device 400 above a housing, in which the semiconductor chip is to be inserted with the active side facing downwardly and on which there are, for example, connecting bumps. It is also possible to place the removed semiconductor chip with the active side facing downwardly directly onto a printed circuit board.

Figure 2:
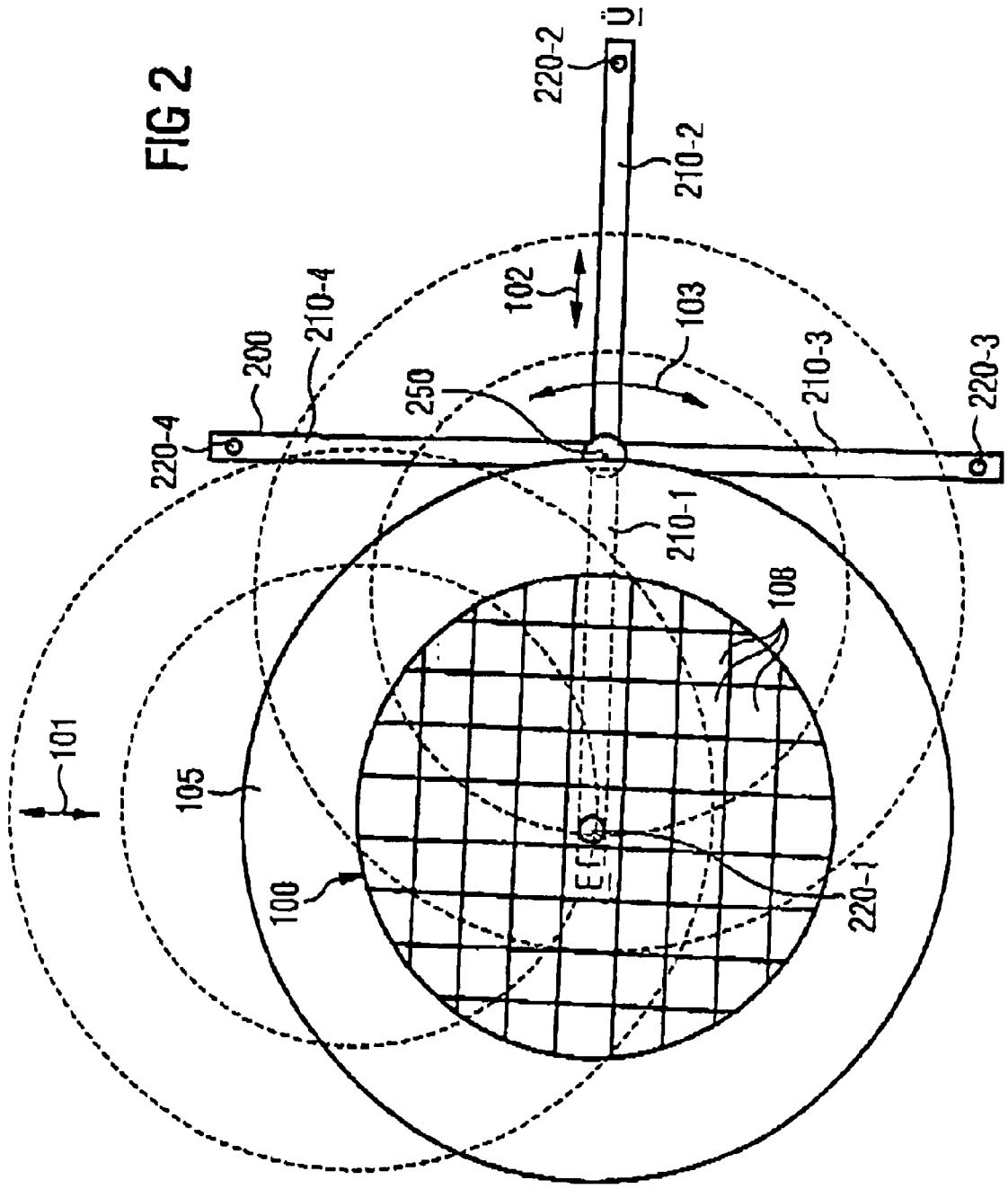
FIG. 2 is a schematic top view of the chip transfer apparatus shown in FIG. 1.

FIG. 2 shows the relative movements of the wafer 100 with respect to the pick-up device 220-1 of the transport device 200, which can be carried out to position the wafer 100 above the removal location E. The possible directions of lateral movement for the removal positioning of a semiconductor chip 108 are illustrated by the arrows 101 and 102. In addition, the possible rotational movements of the transport device 200 about the axis 250 for transporting the removed semiconductor chip from the removal position E to the transfer position Ü are illustrated by the arrow 103. It can also be gathered from FIG. 2 that the transport device 200 is of cross-like design and has four arms 210-1, 210-2, 210-3 and 210-4, which are each provided at their end section with a pick-up device 220-1, 220-2, 220-3 and 220-4. This makes it possible, to pick up, during one revolution of the transport device 200, four semiconductor chips 108, which have been removed from the wafer 100 by means of the ejector pin 280 and have been arranged on one of the pick-up devices 220-1, 220-2, 220-3 and 220-4, and to transport them from the removal position E to the transfer position Ü. From the transfer position Ü, the removed semiconductor chips 108 can be handled further by means of a handling device for further processing by means of known devices belonging to flip-chip technology or else die bonding technology or SMD technology.

What is claimed is:

1. A method of transferring semiconductor chips from a substantially flat wafer having an active side with a plurality of individual semiconductor chips formed thereon and a support side opposite said active side to a receiver, said method comprising the steps of: supporting the wafer with its support side attached by way of an adhesive sheet to a support structure, cutting the wafer into segments corresponding to said individual semiconductor chips so that said semiconductor chips are individually supported on said adhesive sheet with their active sides exposed and facing away from said adhesive sheet, moving said support structure with said individual semiconductor chips into a position wherein a particular semiconductor chip to be removed is positioned in a removal location above a receiver location, and pushing the adhesive sheet at the particular semiconductor chip location downwardly so as to release said particular semiconductor chip and transfer it with the active side thereof onto said receiver.

2. A method according to claim 1, wherein said receiver is a transport device, whereby said semiconductor is moved to a transfer location for being picked up by a handling device.

3. A method according to claim 2, wherein said individual semiconductor chip is picked up by said handling device with the exposed active surface thereof facing downwardly for deposit in the same orientation in a housing of for installation on a printed circuit board.

4. A method according to claim 2, wherein said individual semiconductor chip is moved from said removal location to said transfer location in a plane extending parallel to said wafer.

* * * * *